United States Patent

Greene

[15] 3,675,143

[45] July 4, 1972

[54] ALL-FET LINEAR VOLTAGE AMPLIFIER

[72] Inventor: Richard M. Greene, Smithtown, N.Y.

[73] Assignee: GTE Laboratories Incorporated

[22] Filed: Feb. 16, 1970

[21] Appl. No.: 11,599

[52] U.S. Cl. .......................................................330/18, 330/35

[51] Int. Cl. ..............................................................H03f 3/16

[58] Field of Search .....................330/35, 38 M, 18; 307/304

[56] References Cited

UNITED STATES PATENTS 3,024,422 3/1962 Jansson....................................330/18

3,508,084 4/1970 Warner..................................307/304

OTHER PUBLICATIONS

Ester, " New Linear IC Amplifier Offers Flexibility" The Electronic Engineer, April 1967 pp. 58–60

*Primary Examiner*—Roy Lake
*Assistant Examiner*—James B. Mullins
*Attorney*—Irving M. Kriegsman

[57] ABSTRACT

A linear voltage amplifier circuit which utilizes a plurality of field-effect devices having substantially identical operating characteristics. The devices are connected in a series arrangement with the source electrode of each device coupled to the drain electrode of its adjacent device. Each of the devices except one selected device has its gate electrode coupled to its drain electrode. An input terminal is coupled to the gate electrode of the selected device and an output terminal is connected to the drain electrode of one of the devices. In a preferred embodiment of the invention the gain of the amplifier is $-(n-1)$ where $n$ equals the number of devices in the series arrangement.

9 Claims, 8 Drawing Figures

INVENTOR
RICHARD GREENE

M. Novack
ATTORNEY

INVENTOR.
RICHARD GREENE

M. Novack
ATTORNEY.

INVENTOR.
RICHARD GREENE

M. Novack
ATTORNEY

ALL-FET LINEAR VOLTAGE AMPLIFIER

BACKGROUND OF THE INVENTION

This invention relates to amplifier circuits and, more particularly, to a linear voltage amplifier circuit which utilizes field-effect transistors.

In designing integrated circuits a common objective is to minimize the use of passive components such as resistors, which require relatively large surface areas, while maximizing the use of active components which are usually significantly smaller. This one reason that the field-effect transistor (FET), and especially the insulated gate field-effect transistor (IGFET), has become a widely used active component for integrated circuits.

A FET consists of a substrate of semiconductor material having regions therein denoted as "source" and "drain." A carrier conduction channel lies between these regions and the conductance of this channel is controlled by an electric field. In an insulated-gate field-effect transistor (IGFET) a control electrode known as a "gate" overlies the channel and is separated therefrom by a region of insulating material. Voltages applied between the gate electrode and the semiconductor substrate control the conductance of the channel by field effect. A "metal-oxide-semi-conductor field-effect transistor" (MOSFET) is a type of IGFET in which the insulating material is an oxide layer and the gate is an overlying metal layer. The MOSFET generally requires less surface area and fewer manufacturing steps than the conventional bipolar transistor.

A voltage amplifier which utilizes a FET in series with a fixed load resistor produces an output voltage which varies as a nonlinear function of the input voltage. This nonlinearity is due to the nonlinear transfer characteristic of a FET device which, when operated in its saturation region, exhibits "square law" gain characteristics. This means that the drain-to-source current through the device varies as the square of the gate voltage applied to the device. To achieve a linear output it has been suggested that a second FET (a "load FET") be employed in place of the fixed load resistor. With this scheme, the load FET is coupled in series with the first mentioned FET (called the "driver FET") so that the same drain-to-source current flows through each device. Since both devices have substantially "square law" characteristics their nonlinear characteristics offset each other and a linear output voltage is obtained. As will be demonstrated below, a voltage gain having unity magnitude is obtainable from such a linear amplifier when two identical FET devices are employed. To obtain a non-unity gain from this circuit it is necessary to employ two FET devices having different individual gain constants. This can be achieved by utilizing devices of differing geometries. For example, as will be seen, by using a driver MOSFET which has a channel width four times greater than that of a load MOSFET a gain magnitude of two can be obtained.

There are disadvantages, however, in using devices of differing geometries to make a voltage amplifier, especially in integrated circuit technology. From a manufacturing standpoint it is easier and therefore more desirable to fabricate a number of identical devices on a substrate. Furthermore, when devices of different geometries are fabricated on the same substrate manufacturing errors tend to degrade performance of a circuit using such devices more than if identical devices had been used. To illustrate, it can be noted that with identical devices an error in a manufacturing step will likely lead to "consistent errors," i.e., equivalent parameter deviations in each device. For example, if a given dimension of each device is in error by a fixed amount each device will have a certain percentage error in performance, but the devices will still be substantially identical. With non-identical devices, however, such errors tend to affect the individual devices in different ways. For example, if a dimension of each device is in error by a given amount there will likely be a largest percentage error in the performance of the device of smallest geometry.

An additional disadvantage in using devices of differing geometries is the lack of thermal stability of the voltage amplifier. As will be seen, the expression for the output voltage of the two-device amplifier previously described contains terms for the threshold voltage of each device. When identical devices are used, these threshold voltage terms cancel out. When non-identical devices are used, the output voltage is affected by unlike variations in the threshold voltages of the two devices. Therefore, since threshold voltage is temperature dependent, variations in temperature will cause an undesirable drifting of the amplifier output voltage.

The circuit of the instant invention utilizes a number of identical devices and achieves gains other than unity without sacrificing temperature stability. Also, the gain of the disclosed circuit is not substantially affected by like dimensional variations in each device as often occurs in integrated circuit manufacture. The circuit is therefore particularly suitable for fabrication in integrated circuit form. (A related circuit which also utilizes a number of identical FET devices is disclosed in my co-pending U.S. application Ser. No. 11,598, filed Feb. 16, 1970 and assigned to the same assignee as the present invention. The referenced application discloses a linear voltage difference amplifier.)

SUMMARY OF THE INVENTION

The present invention is directed to a linear voltage amplifier circuit which includes a plurality of at least three field effect transistor devices having substantially identical operating characteristics. The devices are connected in a series arrangement with the source electrode of each device coupled to the drain electrode of the next device in the arrangement. The source electrode of the device at one end of the arrangement and the drain electrode of the device at the other end of the arrangement define the "source end" and the "drain end," respectively, of the series arrangement. Each of the devices except one selected device has its gate electrode coupled to its drain electrode. An input terminal is coupled to the gate electrode of the selected device. Means are provided for applying a bias voltage between the drain end and the source end of the series arrangement. In addition, an output terminal is coupled to the drain electrode of one of the devices.

The voltage gain of the disclosed amplifier circuit depends upon the number of devices in the arrangement and also upon the positions of the input and output terminals. In a preferred embodiment of the invention the selected device is at the source end of the arrangement and the output terminal is coupled to the drain electrode of the selected device. In this embodiment the voltage gain of the amplifier is $-(n-1)$ where n equals the number of devices in the arrangement.

Further features and advantages of the invention will become more readily apparent from the following detailed description when taken in conjunction with the accompanying drawings.

DESCRIPTION OF THE PREFERRED EMBODIMENTS

Figure 1:
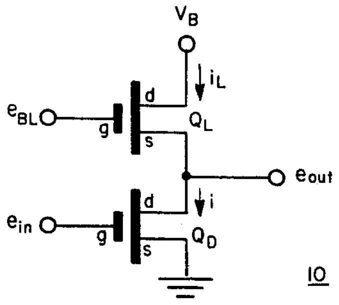
PRIOR ART Fig. 1.
FIG. 1 is a schematic diagram of a prior art amplifier circuit.

Before describing the present invention in detail, it will be helpful to understand the functioning of a prior art linear amplifier which utilizes two series connected MOSFETS. FIG. 1 shows an amplifier circuit 10 consisting of a "driver transistor" $Q_D$ and a "load transistor" $Q_L$. The devices $Q_D$ and $Q_L$ are arranged in series with the source electrode *s* of $Q_L$ connected to the drain electrode *d* of $Q_D$. The output voltage of the amplifier, $e_o$, is taken at this connection point. A bias voltage $V_B$ is applied between the drain electrode of $Q_l$and source electrode of $Q_D$ which is at ground reference potential. The substrate of each MOSFET (not shown) is at ground potential as is the normal practice for devices fabricated on the same substrate. The input voltage $e_{in}$ is applied to the gate electrode *g* of $Q_D$. The devices $Q_L$ and $Q_D$ both operate in their saturation regions which operation is attained by applying an appropriate bias voltage $e_{BL}$ to the gate electrode of $Q_L$ and by constraining $e_{in}$ to an appropriate range of voltages.

With both MOSFETS operating in saturation, the following relationships can be set forth:

$$i_L = K_L(V_{gsL} - V_{thL})^2$$
$$i_D = K_D(V_{gsD} - V_{thD})^2$$

wherein:

$i_L$ is the drain-to-source current of $Q_L$
$K_L$ is the gain constant of $Q_L$
$V_{thL}$ is the threshold voltage of $Q_L$
$V_{gsL}$ is the gate-to-source voltage of $Q_L$
$i_D$ is the gain constant of $Q_D$
$K_D$ is the gain constant of $Q_D$
$V_{thD}$ is the threshold voltage of $Q_D$, and
$V_{gsD}$ is the gate-to-source voltage for $Q_D$.

It can be seen by inspection that $$V_{gsL} = e_{BL} - e_0 \text{ and that } V_{gsD} = e_{in}$$

Since there is no appreciable gate current for either device the currents $i_D$ and $i_L$ are substantially equal and can be equated and solved to yield the following:

$$e_0 = -\sqrt{\frac{K_D}{K_L}}\, e_{in} + V_{BL} + \sqrt{\frac{K_D}{K_L}}\, V_{thD} - V_{thL}$$

Differentiating this equation yields the circuit voltage gain as follows:

$$\delta e_o/\delta e_{in} = -\sqrt{\frac{K_D}{K_L}}$$

From this gain equation it is seen that for identical $Q_L$ and $Q_D$ a voltage gain of −1 is obtained. In this case the amplifier is thermally stable since the terms in the equation for $e_o$ which depend upon threshold voltage cancel. However, to achieve a voltage gain having a magnitude other than unity with this circuit configuration it is necessary to utilize a pair of non-identical devices having different gain constants.

The gain constant of a MOSFET can be represented by the general formula $$K = \frac{u\epsilon_g W}{-2t_g S}$$

where:

$u$ is the carrier mobility in the semiconductor material
$\epsilon_g$ is the dielectric constant of gate insulation
$W$ is the width of the device channel $S$ is the length of the device channel and
$t_g$ is the thickness of the gate insulation.

When the devices $Q_L$ and $Q_D$ are fabricated in close proximity on the same substrate, the values of $u$, $\epsilon_g$ and $t_g$ are generally the same for each device. Variations in the geometrical factors $W$ and $S$ are therefore used to achieve the desired gain. For example, a voltage gain of −2 can be achieved by making the width of the driver MOSFET channel ($W_D$) four times as large as the width of the load MOSFET channel ($W_L$) while keeping other parameters identical. In this case it is seen that the voltage gain reduces to $-\sqrt{W_D/W_L}$ which equals the desired value of −2. The above equation for $e_o$ indicates, though, that this amplifier would not be thermally stable as the terms $$\text{“}\sqrt{\frac{K_D}{K_L}}\, V_{thD}\text{” and “}-V_{thL}\text{”}$$

would generally change by different amounts with changes in temperature.

Figure 2:
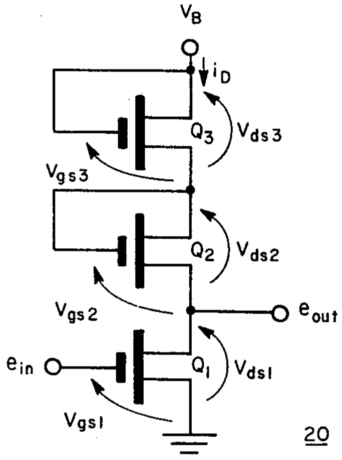
FIGS. 2–8 are schematic circuit diagrams of embodiments of the invention.

Referring now to FIG. 2, there is shown a linear voltage amplifier circuit 20 in accordance with the invention. Field-effect transistors $Q_1$, $Q_2$ and $Q_3$ have substantially identical operating characteristics and are connected in a series arrangement with the drain electrode of $Q_1$ coupled to the source electrode of $Q_2$ and the drain electrode of $Q_2$ coupled to the source electrode of $Q_3$. The transistors of FIG. 2 and subsequent embodiments are each depicted as MOSFETS but the invention applies generally to all field-effect devices which exhibit square law characteristics. The source electrode of $Q_1$ is coupled to ground reference potential and the drain electrode of $Q_3$ is coupled to a bias voltage $V_B$. (All voltages are measured with respect to ground potential.) The gate electrodes of $Q_2$ and $Q_3$ are coupled to their respective drain electrodes. An input voltage $e_{in}$ is applied to the gate electrode of $Q_1$ and an output voltage $e_{out}$ is measured at the drain electrode of $Q_1$.

For linear operation of voltage amplifier 20 the devices of the amplifier should operate in their saturation regions so that each device exhibits square law characteristics. In general, a MOSFET will operate in its saturation region whenever $V_{th} < V_{gs} \leq V_{ds} + V_{th}$ where $V_{ds}$ and $V_{gs}$ are the drain-to-source and gate-to-source voltages of the device and $V_{th}$ is the threshold voltage of the device. It is seen that $Q_2$ and $Q_3$ will therefore operate in saturation since for these devices $V_{ds}$ equals $V_{gs}$ and the above condition is met. In addition, $Q_1$ is also constrained to operation in its saturation region by limiting the input voltage to a range of values $$V_{th} < e_{in} \leq \frac{V_B + V_{th}}{3}$$

The drain current in each device of amplifier 20 is substantially equal since virtually no gate current flows in the IGFET devices. When each device is operating in the saturation region, the following square-law relationships (assuming negligible drain-to-source saturation leakage) are in effect:

$$i_D = K(V_{gs1} - V_{th})^2$$
$$i_D = K(V_{gs2} - V_{th})^2$$
$$i_D = K(V_{gs3} - V_{th})^2$$

where:

$i_D$ is the drain current through each device,
$K$ is the gain constant of each device, $V_{th}$ is the threshold voltage of each device, and
$V_{gs1}$, $V_{gs2}$ and $V_{gs3}$ are the gate-to-source voltages of $Q_1$, $Q_2$ and $Q_3$ respectively.

It should be noted that the values of $K$ and $V_{th}$ for each device are the same since substantially identical devices are being used. This is preferably achieved in practice by fabricating the devices in close proximity on the same semiconductor wafer. The above relationships are simultaneously satisfied only if $V_{gs1} = V_{gs2} = V_{gs3}$. Since $V_{gs1} = e_{in}$, it is seen that $V_{gs2} = V_{gs3} = e_{in}$. The voltage drop across the series arrangement can be expressed by the equation $$V_B = V_{ds1} + V_{ds2} + V_{ds3}$$

where $V_{ds1}$, $V_{ds2}$ and $V_{ds3}$ are the drain-to-source voltages of $Q_1$, $Q_2$ and $Q_3$ respectively. Noting that $V_{ds1} = e_{out}$, this equation can be rewritten as $$e_{out} = V_B - V_{ds2} = V_{ds3}.$$

Substituting $e_{in}$ for $V_{ds2}$ and $V_{ds3}$ yields $$e_{out} = V_B - 2e_{in}.$$

Differentiating this equation gives $$\delta e_{out}/\delta e_{in} = -2.$$

It is therefore seen that the circuit produces a voltage gain of −2 by utilizing three identical MOSFETS. The circuit is thermally stable since the equation for $e_{out}$ does not depend upon threshold voltages which vary with temperature.

The gain of amplifier 20 as derived from the above equations can be alternatively visualized by assuming that $e_{in}$ has been at some predetermined voltage which is now increased by a voltage $\Delta e_{in}$. This means that the gate-to-source voltage of $Q_1$, i.e., $V_{gs1}$, increases by $\Delta e_{in}$. As indicated above, the gate-to-source voltage of each device must "track" since the devices are identical, are in saturation, and have the same drain-to-source current. The gate voltage of $Q_3$ is fixed at bias voltage $V_B$, so in order for $V_{gs3}$ to track $V_{gs1}$ the voltage at the source electrode of $Q_3$ must decrease by $\Delta e_{in}$. The gate electrode of $Q_2$ is coupled to the source electrode of $Q_3$ and will also decrease by $\Delta e_{in}$. Therefore, in order for $V_{gs2}$ to track $V_{gs1}$ the source electrode of $Q_2$ ($_{\text{at which}}$ $e_{out}$ is taken) must decrease by $2\Delta e_{in}$. It is thus seen that the gate-to-source voltages of each device increases by $\Delta e_{in}$ in satisfaction of the tracking constraint. The result is that an input voltage variation of $\Delta e_{in}$ causes an output voltage variation of $-2\Delta e_{in}$, indicating a voltage gain of −2. A voltage gain of −1 can, if desired, be achieved from the circuit 20 by taking an output voltage at the source electrode of $Q_3$.

Figure 3:
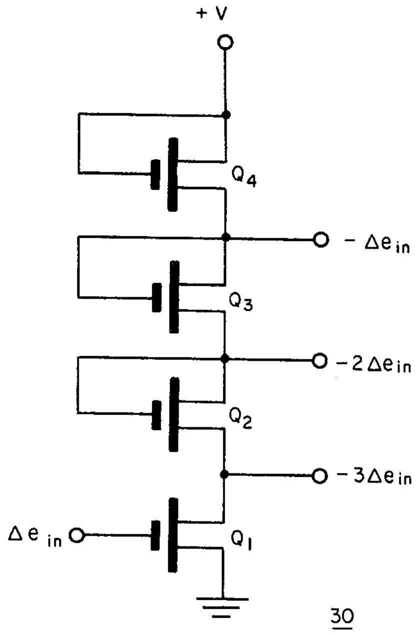

The foregoing analyses can be similarly applied to the voltage amplifier 30 of FIG. 3 which utilizes four FET devices having substantially identical operating characteristics. As the Figure indicates, an input voltage variation of $\Delta e_{in}$ yields voltage variations of $-\Delta e_{in}$, $-2\Delta e_{in}$ or $-3\Delta e_{in}$ depending upon where the output voltage is taken. It is assumed in this as well as subsequently discussed circuits that the input voltage is within the range required for operation of the input transistor in saturation, and also that drain-to-source saturation leakage currents are negligible.

From the above circuits it will be appreciated that by connecting $n$ identical FET devices in the manner disclosed a voltage gain of $-(n-1)$ can be obtained. In a practical sense, however, the number of devices in an arrangement is limited by the buildup of threshold voltages which necessitate the use of increasingly higher bias voltages for longer arrangements.

Figure 4:
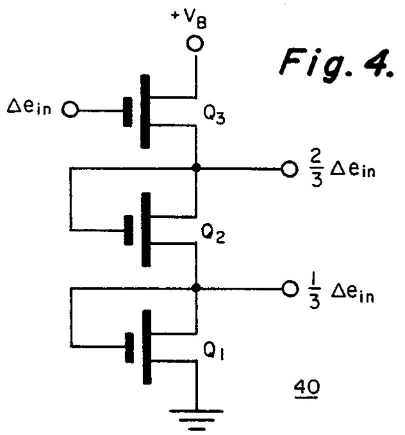

In the foregoing embodiments the input terminal has been coupled to the gate electrode of the device at the source end of the series arrangement. FIG. 4 illustrates a voltage amplifier 40 in which the input terminal is coupled to the device at the drain end of the arrangement. The indicated voltage gains of two thirds and one third are available from this circuit. As above, the gate-to-source voltages of the three devices track each other. In this case the tracking condition requires a gate-to-source voltage variation of ⅓ $\Delta e_{in}$ for an input voltage variation of $\Delta e_{in}$.

Figure 5:
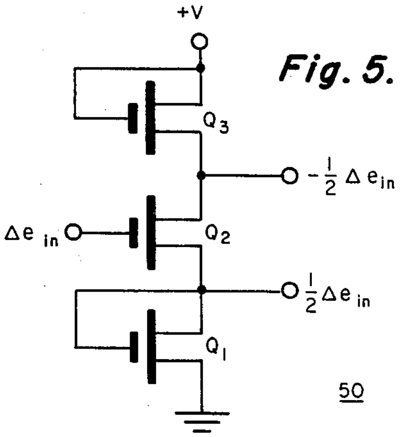

Another embodiment of the invention is depicted in FIG. 5 in which the input terminal coupled to the gate electrode of the middle device $Q_2$. The indicated output variations result from a gate-to-source voltage change of ½ $\Delta e_{in}$ for each device.

Figure 6:
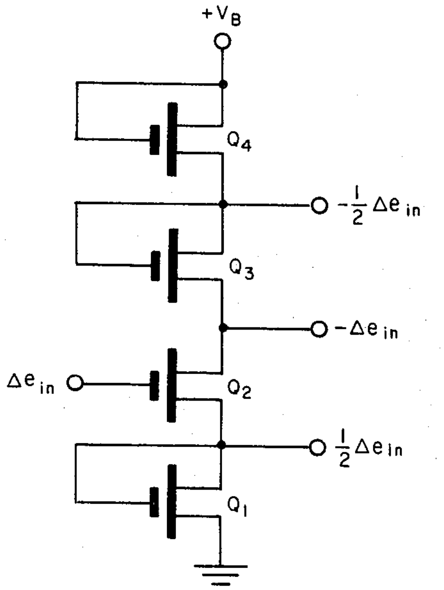
Figure 7:
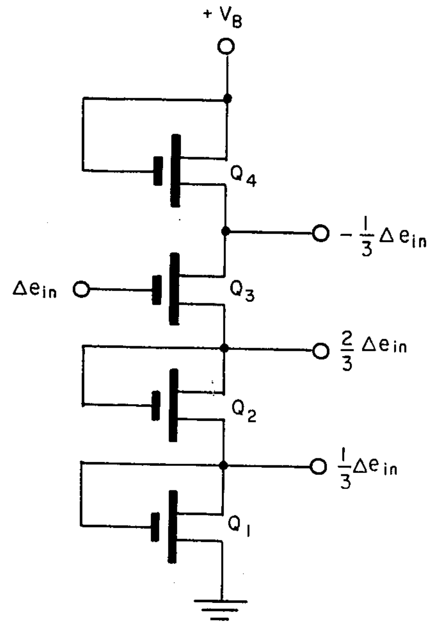
Figure 8:
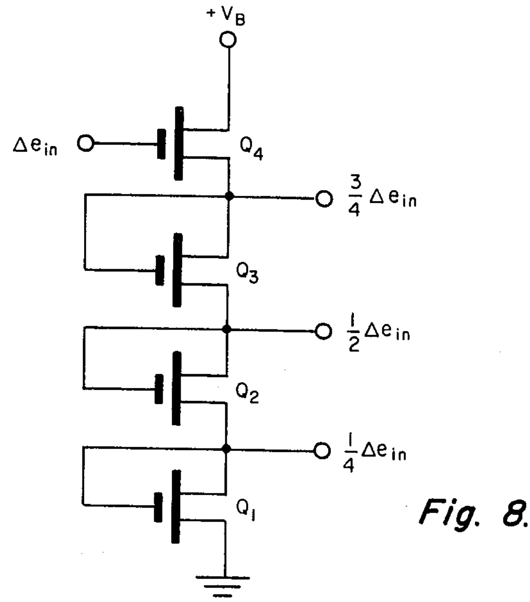

FIGS. 6, 7 and 8 show additional embodiments of a 4-device amplifier with the input terminal taken at the gate electrodes of $Q_2$, $Q_3$ and $Q_4$ respectively. The output variations at the possible output terminals of each circuit are indicated for an input variation of $\Delta e_{in}$.

The voltage gains available from the circuits of the present invention are tabulated in the table below. The lefthand column specifies the designation of the FET at which the input terminal is taken (at the gate electrode). The topmost row specifies the designation of the FET at which the output is measured (at the drain electrode). The FET designations are consistent with the above circuits; i.e., $Q_1$ is at the source end of the series arrangement. The letter n specifies the number of FET devices comprising the amplifier.

| Input at gate terminal of— | Output at drain terminal of— | | | | | | |
|---|---|---|---|---|---|---|---|
| | $Q_1$ | $Q_2$ | $Q_3$ | $Q_4$ | $Q_5$ | $Q_6$ | ---------- |
| $Q_1$ | $-(n-1)$ | $-(n-2)$ | $-(n-3)$ | $-(n-4)$ | $-(n-5)$ | $-(n-6)$ | ---------- |
| $Q_2$ | $\frac{1}{2}$ | $-\frac{1}{2}(n-2)$ | $-\frac{1}{2}(n-3)$ | $-\frac{1}{2}(n-4)$ | $-\frac{1}{2}(n-5)$ | $-\frac{1}{2}(n-6)$ | ---------- |
| $Q_3$ | $\frac{1}{3}$ | $\frac{2}{3}$ | $-\frac{1}{3}(n-3)$ | $-\frac{1}{3}(n-4)$ | $-\frac{1}{3}(n-5)$ | $-\frac{1}{3}(n-6)$ | ---------- |
| $Q_4$ | $\frac{1}{4}$ | $\frac{2}{4}$ | $\frac{3}{4}$ | $-\frac{1}{4}(n-4)$ | $-\frac{1}{4}(n-5)$ | $-\frac{1}{4}(n-6)$ | ---------- |
| $Q_5$ | $\frac{1}{5}$ | $\frac{2}{5}$ | $\frac{3}{5}$ | $\frac{4}{5}$ | $-\frac{1}{5}(n-5)$ | $-\frac{1}{5}(n-6)$ | |
| $Q_6$ | $\frac{1}{6}$ | $\frac{2}{6}$ | $\frac{3}{6}$ | $\frac{4}{6}$ | $\frac{5}{6}$ | $-\frac{1}{6}(n-6)$ | |

Each row in the table indicates the voltage gain available at the various output terminals of the amplifier. For example the row "$Q_3$" indicates the voltage gains available when the input terminal is taken at the gate electrode of $Q_3$ as is the case in the circuits of FIG. 4 and FIG. 7. It is seen that for these circuits gains of one third and two thirds are available at the drain electrodes of $Q_1$ and $Q_2$ respectively as indicated in columns "$Q_1$" and "$Q_2$" of row "$Q_3$". In addition, a gain of one third is available at the drain electrode of $Q_3$ in the circuit of FIG. 7. This is indicated in column "$Q_3$" of row "$Q_3$" as "⅓ $(n-3)$" which equals −⅓ since $n$ is 4 for this case.

What is claimed is:

1. A linear voltage amplifier circuit comprising:

a. a plurality of at least three field-effect transistor devices having substantially identical operating characteristics, each of said devices having drain, source and gate electrodes said devices being connected in a series arrangement with the source electrode of each device coupled to the drain electrode of the next device in the arrangement, said series arrangement having a source end and a drain end, each of said devices except one selected device having its gate electrode connected directly to to its drain electrode;

b. an input terminal coupled to the gate electrode of said selected device;

c. means for applying a bias voltage between the drain and source ends of said series arrangement; and d. an output terminal coupled to one of said drain electrodes.

2. The voltage amplifier circuit as defined by claim 1 wherein said selected device is at the source end of the said series arrangement.

3. The voltage amplifier circuit as defined by claim 2 wherein said output terminal is coupled to the drain electrode of said selected device.

4. The voltage amplifier circuit as defined by claim 3 wherein said devices are insulated gate field-effect transistors.

5. A voltage amplifier circuit comprising:

a. a plurality n of field-effect transistor devices where n equals at least three, said devices having substantially identical operating characteristics and each of said devices having drain, source and gate electrodes, said devices being connected in a series arrangement with the source electrode of each device coupled to the drain electrode of the next device in the order, said series arrangement having a source end and a drain end, each of said devices except the one at the source end of said series arrangement having its gate electrode coupled to its drain electrode;

b. an input terminal coupled to the gate electrode of said one device;

c. means for applying a bias voltage between the drain and source ends of said series arrangement; and d. an output terminal coupled to the drain electrode of said one device, the voltage gain of said amplifier as between said input and output terminals being substantially $-(n-1)$.

6. The voltage amplifier circuit as defined by claim 5 wherein $n$ equals three.

7. The voltage amplifier circuit as defined by claim 6 wherein said devices are insulated-gate field-effect transistors.

8. The voltage amplifier circuit as defined by claim 6 wherein said devices are MOSFETS 9. The voltage amplifier circuit as defined by claim 5 further comprising means for applying an input voltage $e_{in}$ between said input terminal and the source electrode of said one device, said input voltage satisfying the relationship $$V_{th} < e_{in} \leq \frac{V_B + V_{th}}{3}$$

wherein $V_B$ is the bias voltage applied between the drain and source ends of said arrangement and $V_{th}$ is the threshold voltage of said devices.

* * * * *